United States Patent [19]
Tomioka

[11] Patent Number: 5,796,140
[45] Date of Patent: Aug. 18, 1998

[54] NONVOLATILE SEMICONDUCTOR MEMORY DEVICE AND A METHOD OF MAKING THE SAME

[75] Inventor: Yugo Tomioka, Tokyo, Japan

[73] Assignee: Nippon Steel Corporation, Tokyo, Japan

[21] Appl. No.: 517,022

[22] Filed: Aug. 21, 1995

[30] Foreign Application Priority Data

Aug. 23, 1994 [JP] Japan .................................. 6-221010

[51] Int. Cl.⁶ .................................. H01L 29/788
[52] U.S. Cl. .................. 257/316; 257/315; 257/321
[58] Field of Search .................. 257/315, 316, 257/321, 317, 319, 320, 322

[56] References Cited

U.S. PATENT DOCUMENTS

| | | | |
|---|---|---|---|
| 4,892,840 | 1/1990 | Esquivel et al. | 257/316 |
| 5,394,002 | 2/1995 | Peterson | 257/315 |
| 5,455,790 | 10/1995 | Hart et al. | 257/315 |
| 5,469,383 | 11/1995 | McElroy et al. | 257/315 |
| 5,471,423 | 11/1995 | Iwasa | 257/315 |
| 5,545,907 | 8/1996 | Maari | 257/315 |
| 5,569,946 | 10/1996 | Hong | 257/315 |
| 5,585,656 | 12/1996 | Hsue et al. | 257/315 |

FOREIGN PATENT DOCUMENTS 3-136348  6/1991  Japan .................................. 257/315

OTHER PUBLICATIONS

Yoshiaki et al., A High Capacitive–Coupling Ratio (HiCR) Cell for 3V–Only 64 Mbit and Future Flash Memories, 1993 IEDM Technical Digest, pp. 19–22.

Primary Examiner—Sara W. Crane
Assistant Examiner—Phat X. Cao
Attorney, Agent, or Firm—Pollock, Vande Sande & Priddy

[57] ABSTRACT

A nonvolatile semiconductor memory device including a plurality of memory cells, and a method of making this memory device. The nonvolatile semiconductor memory device includes: a semiconductor substrate; an element-isolation structure formed in a surface of the semiconductor substrate and having at least two linear portions extending in a longitudinal direction to define at least one element region between them; and at least one of the memory cells formed in the element region and including: a pair of impurity diffusion layers formed in the surface of said semiconductor substrate along each of the linear portions and a floating gate of a conductive material formed in the element region so as to extend in a lateral direction crossing the longitudinal direction and to bridge the two linear portions, the floating gate including at least a first portion formed on the surface of the semiconductor substrate through a tunnel oxide film and a second portion formed on the surface of the semiconductor substrate through a gate oxide film so as to cover the first portion, the tunnel oxide film having a thickness smaller than that of the gate oxide film, wherein the first portion overlaps through the tunnel oxide film with one of the impurity diffusion layers at an overlapping area extending in the longitudinal direction and having a width equal to or less than 0.18 μm measured in the lateral direction.

10 Claims, 8 Drawing Sheets

FIG. IA
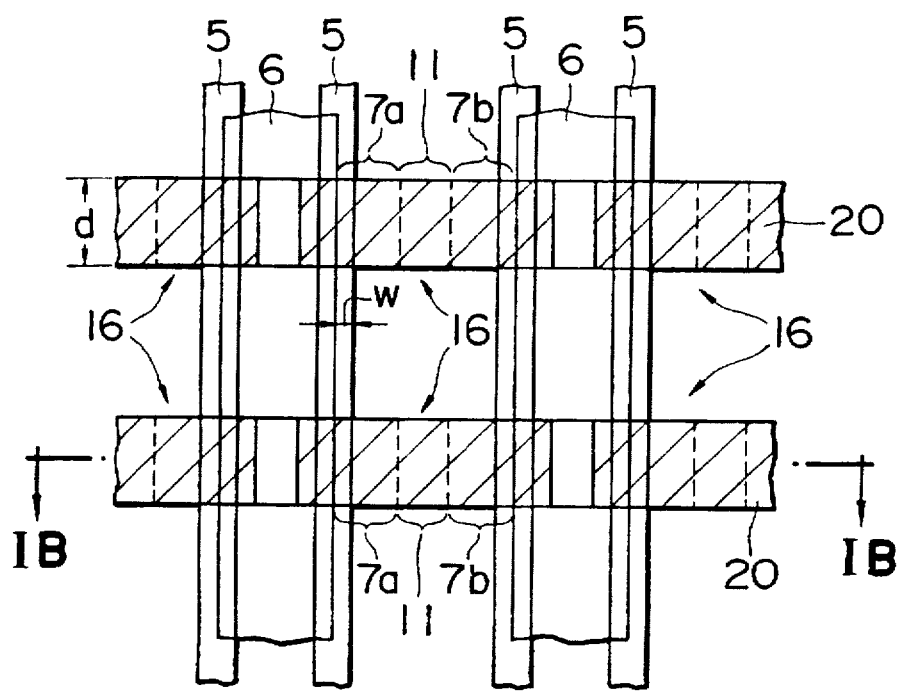
FIG. IB
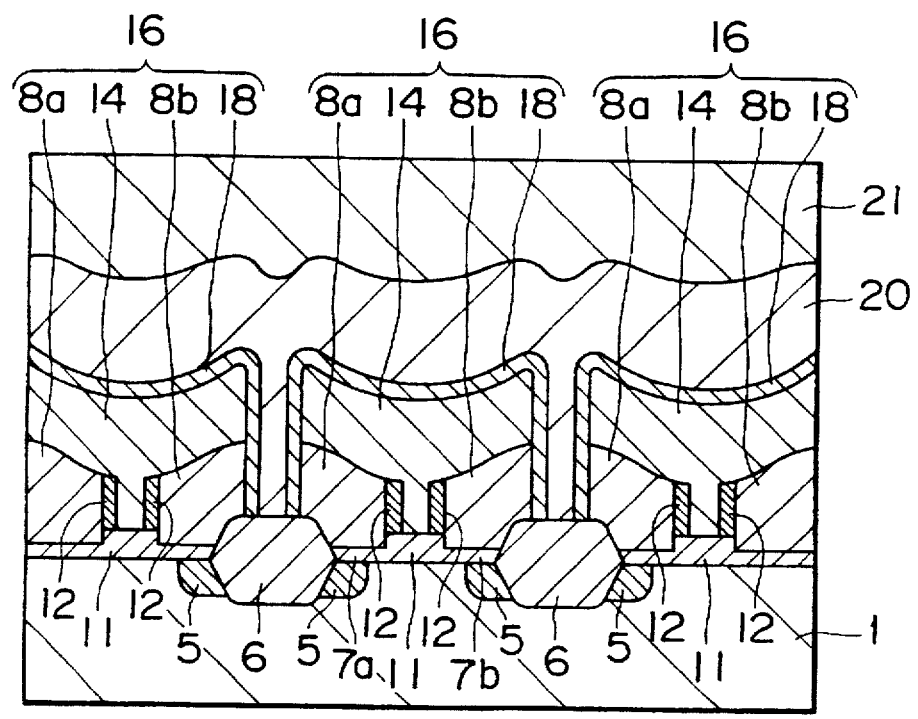

F I G. 2A
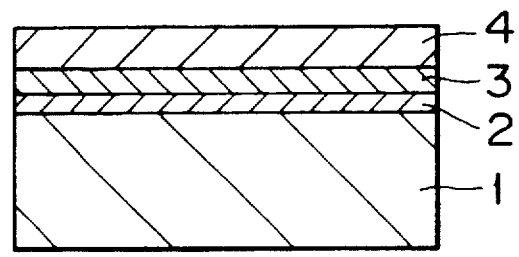
F I G. 2B
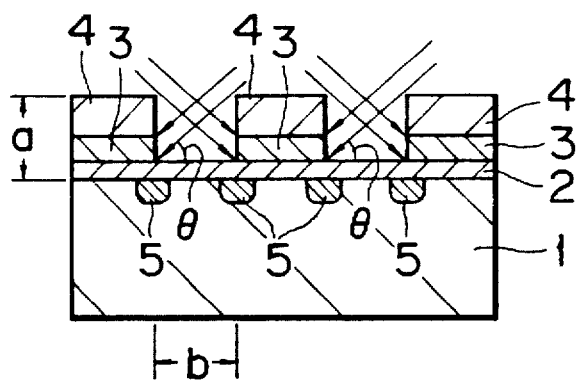
F I G. 2C
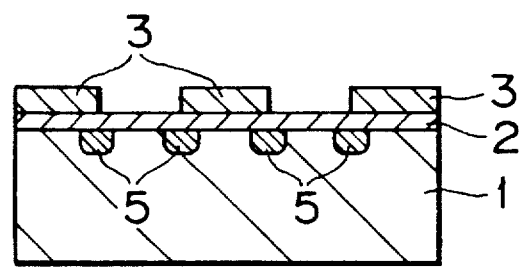
F I G. 2D
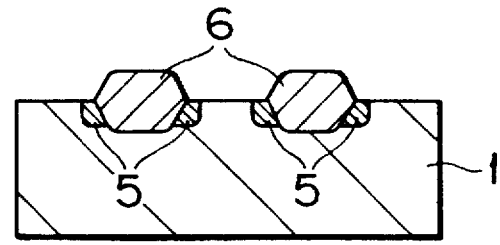

NONVOLATILE SEMICONDUCTOR MEMORY DEVICE AND A METHOD OF MAKING THE SAME

BACKGROUND OF THE INVENTION

1. Field of the Invention

The present invention relates to a nonvolatile semiconductor memory device, more particularly to a nonvolatile semiconductor memory device such as an EEPROM (Electrically Erasable and Programmable Read-Only Memory) drivable under low voltage, and a method of making the same.

2. Description of the Related Art

An EEPROM is a semiconductor memory device capable of electrically writing/erasing data stored in a memory cell, and having a nonvolatile characteristic that even when a power supply is turned OFF, the data is held semipermanently. Among these EEPROMs, a flash type EEPROM (referred to as a "flash memory" hereinafter) for erasing data in unit of all bits, or in unit of block, is suitable to realize high integration, since each memory cell can be constructed of only one MOS transistor.

Very recently, a strong demand has arisen to lower the power supply voltage and operate flash memories with a 5V-only power supply, in order to use flash memories for portable appliances and the like. However, for instance, in a flash memory having a stack type memory cell, there is a problem that a high voltage must be applied to the source through which a high current flows during data erasing operation, which prevents use of a 5V-only power supply. To solve this problem, there is a method of applying a negative voltage to a control gate of a memory cell during the data erasing operation. However, this method requires a negative voltage generating circuit, a transistor having a high dielectric strength, a triple well structure and so on. Also, this method requires a complex circuit. Therefore, as a memory cell having a relatively simple structure and operable by a single 5V-power supply, a memory cell has been proposed which has a structure as described in "A High Capacitive-Coupling Ratio (HiCR) Cell for 3V-Only 64 Mbit and Future Flash Memories" (Yoshiaki S. et. al., 1993, IEDM Technical Digest, pages 19 to 22). The method of making the memory cell described in the above publication will now be explained with reference to FIG. 7.

As shown in FIG. 7A, after the field oxide film 102 has been formed on the P-type silicon substrate 101 by way of the LOCOS method, the gate oxide film 103, polycrystalline silicon film 104, silicon oxide film 105, and silicon nitride film 106 are formed in a pattern such that these films only remain in a region where the floating gate is to be formed.

Next, as shown in FIG. 7B, after a thermal oxide film 108 has been formed in a pattern as shown in this drawing, the N-type impurity is ion implanted therein by using the polycrystalline silicon film 104 and others as a mask thereby forming the impurity diffusion layer 109. Thereafter, the sidewall films 110 of the polycrystalline silicon film 104 and others are formed by a silicon nitride film. Furthermore, a silicon oxide film 119 having a relatively large thickness is formed by way of the LOCOS method, while using the sidewall film 110 as an antioxide film.

Next, as shown in FIG. 7C, after the silicon nitride film 106 and the sidewall films 110 have been removed, the thermal oxide film 108 and the silicon oxide film 105 are removed, and furthermore, the sacrificial oxide film (not shown) is formed and then removed. Then, a tunneling oxynitride film 112 is formed on the surface of the silicon substrate 101, from which the sidewall films 110 have been removed, by way of the rapid thermal process and the like. Thereafter, the polycrystalline silicon film 113 is formed over the entire surface. It should be noted that since the tunneling oxynitride film 112 is required to have a better film characteristic, the CVD method is not suitable to manufacture the tunneling oxynitride film 112.

Next, as shown in FIG. 7D, the polycrystalline silicon film 113 is subjected to anisotropic etching, thereby forming sidewall silicon films 114 which cover the tunneling oxynitride film 112 on the side surfaces of the polycrystalline silicon film 104.

Then, as shown in FIG. 7E, after the tunneling oxynitride film 112 formed on the polycrystalline silicon film 104 has been removed, a polycrystalline silicon film 115 is formed over the entire surface.

Next, as shown in FIG. 7F, the polycrystalline silicon film 115 is patterned in the shape of the floating gate. Subsequently, an insulating film 116 such as an ONO film is formed on the polycrystalline silicon film 115, and a control gate 117 serving as a word line is formed on the insulating film 116.

Since the area of the tunneling nitride film 112 is made very narrow in the memory cell of the flash memory manufactured in accordance with the above-described steps, the capacitance between the channel region and the floating gate (constructed of the polycrystalline silicon film 104, the sidewall silicon films 114, and the polycrystalline silicon film 115) can be made very low. As a result, the concentration of electric field is higher at the tunneling oxynitride film 112 so that the extraction or injection of electrons can be effectively performed by the Fowler-Nordheim tunneling (FN tunneling) phenomenon and the memory cell can be operated under low voltage. For instance, the use of a 5V-only power supply to drive the memory cell may be realized. It should be noted that the above-described flash memory manufacturing method may also be applied to MNOS type EEPROMs.

However, the flash memory manufacturing method described in the above publication requires many complicated steps such that after the sidewall films 110 have been formed, the thermal oxidation is carried out to form the silicon oxide film 119, and further after the sidewall films 110 have been removed, the tunneling oxynitride film 112 is formed. In particular, the above-described method involves a problem thats since the steps of forming the sidewall films and performing the thermal oxidation by the LOCOS method are carried out two times, the time required for manufacturing becomes very long, and the throughput is lowered.

Also, in the flash memory manufacturing method described in the above-explained publication, especially, since the silicon oxide film 119 is simultaneously removed by etching in the step of removing the thermal oxidation film 108 and the silicon oxide film 105, the film thickness of the silicon oxide film 119 becomes excessively thin. As a consequence, the storage capacitance between the impurity diffusion layer 109 and the polycrystalline silicon film 115 opposing to each other with the silicon oxide film 119 interposed therebetween becomes large. Therefore, there arises a problem that the concentration of the electric field at the tunneling oxynitride film 112 is prevented and the memory cell cannot operated under a desired low voltage.

SUMMARY OF THE INVENTION

An object of the present invention is to provide a nonvolatile semiconductor memory device operable under low voltage and capable of being simply manufactured in a relatively small number of steps, and also to provide a method of manufacturing such a nonvolatile semiconductor memory device.

A further object of the present invention is to provide a nonvolatile semiconductor memory device capable of having memory cells in higher density than that of the conventional memory device, and also to provide a method of manufacturing such a nonvolatile semiconductor memory device.

To achieve the above-described objects, a nonvolatile semiconductor memory device having a plurality of memory cells, according to the present invention, includes a semiconductor substrate and an element-isolation structure formed in a surface of the semiconductor substrate and having at least two linear portions extending parallel in a longitudinal direction to define at least one element region between the two linear portions. At least one of the memory cells is formed in the element region. Also, a pair of impurity diffusion regions is formed in the surface of the semiconductor substrate along the linear portions of the element-isolation structure, respectively, and a floating gate made of a conductive material is formed in the element region so as to extend in a lateral direction crossing the longitudinal direction and to bridge the two linear portions. The floating gate includes at least one first portion formed on the surface of the semiconductor substrate with a tunneling oxide film interposed therebetween and a second portion formed on the surface of the semiconductor substrate with a gate oxide film interposed therebetween and extending to cover the first portion. The tunneling oxide film has a thickness smaller than that of the gate oxide film, the first portion overlapping through the tunneling oxide film with one of the impurity diffusion regions at its overlapping area extending in the longitudinal direction and having a width equal to or less 0.18 μm measured in the lateral direction.

Also, a method of making a nonvolatile semiconductor memory device, according to the present invention, includes the steps of: forming a tunneling oxide film on a semiconductor substrate; successively forming a first conductive film and an antioxidation film on the tunneling oxide film; selectively removing the first conductive film and the antioxidation film to form a pair of first portions mutually separated from each other at gate regions in which floating gates of memory cells of the semiconductor memory device are to be formed, respectively, each of the first portions including portions of the respective first conductive film and the antioxidation film; removing a part of the tunneling oxide film exposed to a space between the pair of first portions thereby to expose a portion of the semiconductor substrate, and thermally oxidizing the exposed portion of the semiconductor substrate to form a gate oxide film in the space having a thickness thicker than that of the tunneling oxide film; removing the antioxidation film of each of the pair of first portions; forming a second conductive film to cover an entire surface of the semiconductor substrate; selectively removing the second conductive film to form a second portion of the second conductive film covering the pair of the first portions and extending into the space between the pair of the first portions to reach the gate oxide film formed in the space, thereby forming in the gate region, a floating gate having the pair of first portions of the first conductive film and the second portion of the second conductive film; forming a capacitor insulating film covering the floating gate; and forming a third conductive film serving as a control gate on the capacitance insulating film.

According to one aspect of the present invention, the semiconductor substrate is made of a material of a first conductive type, an element isolation structure is formed on the semiconductor substrate to define a plurality of element regions and, at least one of the memory cells constituting the memory device is formed in each of the plurality of element regions, and said method further includes a step of forming an impurity diffusion layer having a second conductivity type different from the first conductivity type by a tilted ion implantation process on a portion of a surface of the semiconductor substrate along an edge of a region where the element-isolation structure is formed.

According to another aspect of the present invention, the semiconductor substrate is made of a material of a first conductive type, an element isolation structure is formed on the semiconductor substrate to define a plurality of element regions, wherein the element-isolation structure includes at least two linear portions extending in parallel to each other and at least one of the element regions is defined between the two linear portions, the control gate is formed in said one element region across the two linear portions, and said method further includes a step of forming an impurity diffusion layer of a second conductivity type different from the first conductivity type by an ion implantation process using the two linear portions and the control gate as a mask, in a surface of the semiconductor substrate, at a portions along the two linear portions and the control gate.

In accordance with the present invention, since the gate insulating film is formed by the thermal oxidation at a portion where the first conductive film formed on the tunneling insulating film is selectively removed, it is no longer required to carry out many complicated steps such as those in the conventional method in which after the sidewall films are formed, the thermal oxidation is carried out to form the silicon oxide film, and then the sidewall films are removed. Also, there is no possibility of the portion other than the tunneling insulating film is etched too much during the manufacturing process so that the thickness of this etched portion becomes thin. Therefore, the concentration of the electric field at the tunneling insulating film is ensured.

Also, the impurity diffusion layer is formed in the semiconductor substrate at its portion near the edge of the element-isolation structure by the tilted ion implantation process, so that the impurity diffusion layer can be simply formed in the self-alignment manner in the semiconductor substrate at the portion near the edge of the element-isolation structure. Furthermore, since the impurity diffusion layer is common to a plurality of memory cells disposed along the element-isolation structure, it is not required to provide each of the memory cells with one contact. Thus, the memory cells can be highly integrated.

Also, since the overlapping portion between the tunneling insulating film and the impurity diffusion layer is formed by diffusing the impurity, which has been introduced by the ion implantation process using the control gate and the element isolation structure as a mask, in the lateral direction, it is not required to conduct the step of forming the tunneling insulating film on the ion implanted surface of the semiconductor substrate. Thus, the tunneling insulating film can be formed with better film qualities.

BRIEF DESCRIPTION OF THE DRAWINGS

FIG. 1A is a plan view representing an arrangement of elements of a nonvolatile semiconductor memory device made by a method according to a first embodiment of the present invention;

FIG. 1B is a sectional view, taken along a line IB—IB of FIG. 1A;

FIGS. 2A to 2K are sectional views in the respective steps of the method of making the nonvolatile semiconductor memory device according to the first embodiment of the present invention;

DESCRIPTION OF THE PREFERRED EMBODIMENTS

Figure 2E:
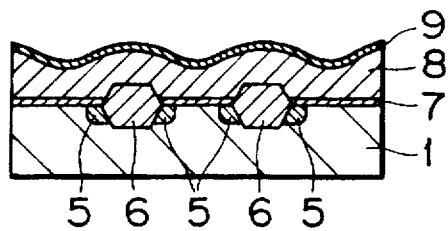

Referring now to the drawings, an embodiment of the present invention will be described.

FIG. 1A is a plan view schematically showing a part of the memory cell array in a flash memory according to a first embodiment of the invention. FIG. 1B is a sectional view, taken along a line IB—IB of FIG. 1A.

In FIG. 1A, although only two portions of a field oxide film 6 extending in the longitudinal direction are represented, there are portions (not shown) extending in the lateral direction so that the field oxide film is formed in such a manner that a plurality of rectangular element regions are defined thereby. Along a direction perpendicular to the longitudinal direction of the field oxide film 6, a control gate (word line) 20 commonly used by a plurality of memory cells is formed. Then, a floating gate 16 of each of the memory cells is formed below the control gate 20 in the element region surrounded by the field oxide film 6. On a surface of a silicon substrate 1, a gate oxide film 11 having a thickness thicker than the thicknesses of tunneling oxide films 7a and 7b located adjacent to the gate oxide film is formed at a portion under the respective floating gates 16 in such a manner that a boundary between each of the tunneling oxide films 7a, 7b and the gate oxide film extends in a direction along the field oxide film 6 (see FIG. 1B).

A source/drain layer 5 of an N type impurity diffusion layer is formed on a surface of the silicon substrate at a portion adjacent to each edge portion of the field oxide film 6 extending in the longitudinal direction along the field oxide film 6. That is, the source/drain 5 is commonly used for each of a plurality of memory cells arranged along the longitudinal direction of the field oxide film 6. One (drain) of the source/drains 5 is connected via a bit contact (not shown) provided at each of a predetermined block to a bit line (not shown), and the other (source) of the source/drains 5 is connected via a source contact (not shown) provided at each of a predetermined block to a source line (not shown). With this structure, it is unnecessary to provide the bit contact and the source contact for each of the memory cells so that a higher integration of the memory cells may be achieved along the longitudinal direction of the field oxide film 6.

In FIG. 1B, each of the memory cells has a floating gate 16 including polycrystalline silicon films 14, 8a and 8b, which is formed on the P-type silicon substrate 1 with the tunneling oxide films 7a, 7b and the gate oxide film 11 interposed therebetween, a control gate 20 which is formed on the floating gate 16 with an ONO film 18 interposed therebetween and the source/drains 5 which are formed on the surface of the silicon substrate at portions adjacent to the edge portions of the field oxide film 6. Also, on the gate oxide film 11, two silicon oxide films 12 are formed to extend upwardly along boundaries between the polycrystalline silicon film 14 and each of the polycrystal silicon films 8a and 8b. Furthermore, the memory cell is wholly covered with an interlayer insulating film 21.

As seen from FIG. 1A and FIG. 1B, in the flash memory of this embodiment, the injection and extraction of electrons is performed between the source/drain 5 and the floating gate 16 through a portion where the source/drain 5 overlaps or is in direct contact with each of the tunneling oxide films 7a, 7b. In one of the source/drains 5 of a memory cell, the overlap portion is a rectangular shape having a width corresponding to a distance "w" between the edge of the field oxide film 6 and the edge of the source/drain region 5 closer to the gate oxide film 11 and a length corresponding to a width "d" of the control gate 20. Since this overlap portion is made to be very narrow, for example, (w=0.1 μm)×(d=0.6 μm) approximately, the capacitance between the floating gate 16 and the source/drain 5 can be made very small. It should be noted that the width "w" of the overlap portion is 0.1 to 0.18 μm, preferably 0.1 μm. As a result, the field concentration at the tunneling oxide films 7a and 7b is increased so that the electron injection and extraction due to the FN tunneling phenomenon can be effectively performed, and the memory cell can be driven by a single-voltage power supply with a low voltage of 3.3V. It should also be noted that only one of the tunneling oxide films 7a and 7b may be formed, and in this case, the field concentration at the tunneling oxide film may be further increased.

As to the memory cell shown in FIG. 1B, since the floating gate 16 is formed by the polycrystalline silicon films 8a, 8b and 14, the height of this floating gate can be made high, and the area of the ONO film 18 sandwiched between the control gate 20 and the floating gate 16 can be made relatively large. As a result, the capacitance between the floating gate 16 and the control gate 20 can be increased to facilitate low voltage operation. Also, since the source/drain 5 is formed at the portion near the edge of the field oxide film 6 and the channel is formed between them, the memory cell can be made narrow in the longitudinal direction of the control gate 20, so that higher integration of the memory cells can be achieved.

Next, a method of making the flash memory according to this embodiment will now be described with reference to sectional views corresponding to FIG. 1B at the respective steps as shown in FIG. 2A to FIG. 2K.

First, as shown in FIG. 2A, after a pad oxide film 2 having a thickness of about 30 to 50 nm has been formed over the P-type silicon substrate 1 by way of either the thermal oxidation process or the CVD process, the silicon nitride film 3 having a thickness of about 100 to 300 nm is formed over the P-type silicon film 2 by the CVD process. Thereafter, a photoresist 4 is coated over the entire surface.

Next, as shown in FIG. 2B, the photoresist 4 is removed by the photolithography at a portion where the element isolation region is to be made. The remaining photoresist 4 is used as a mask to carry out the anisotropic dry etching so that the silicon nitride film 3 is selectively removed. Thereafter, while using the silicon nitride film 3 and the photoresist 4 as a mask, an N-type impurity such as As is ion implanted in an oblique direction, so that the impurity is ion implanted into the silicon substrate 1 to thereby form the source/drains 5 corresponding to the impurity diffusion layers on the surface of the silicon substrate 1. The ion implantation condition is set such that when using As as the impurity, the energy is selected to be 50 to 90 keV and the dose rate is set to $5 \times 10^{15}$ cm$^{-2}$.

Further, the angle θ of ion implantation is determined to satisfy the following equation in which $\underline{a}$ is the sum (height) in thickness of the silicon nitride film 3 and the photoresist 4 and $\underline{b}$ is a distance between adjacent patterns as shown in FIG. 2B:

$$\theta = \tan^{-1}(a/b)$$

For example, when each of the silicon nitride film 3 and the photoresist 4 has a thickness of 100 nm (a=0.20 μm) and the distance $\underline{b}$ is 1 μm, the value of θ is about 11° to 12° and when the thicknesses of the silicon nitride film 3 and the photoresist 4 are 300 nm and 550 nm, respectively, (a=0.85 μm) and the distance b is 1 μm, the value of θ is about 40° to 41°. Incidentally, the angle of ion implantation may be suitably adjusted by conducting the tilted ion implantation after removing the photresist 4.

In this manner, by effecting the ion implantation in an oblique direction into the silicon substrate 1 using each lamination of the silicon nitride film 3 and the photresist 4 as a mask, the source/drains 5 are formed in self-alignment at areas near the edge portions of the lamination. Further, the impurity as injected is laterally diffused in the succeeding thermal treatment so that the each of the source/drains 5 is formed under the pad oxide film 2 to partially overlap with the lamination.

Next, as shown in FIG. 2C, the photoresist 4 is removed.

Next, as shown in FIG. 2D, the silicon substrate 1 is subjected to thermal oxidation by the LOCOS method using the silicon nitride film 3 as an anti-oxidation mask to form a field oxide film 6 having a thickness of about 450 to 600 μm. Thus, the source/drains 5 are formed on the surface of the silicon substrate 1 near the edge portions of the field oxide film 6 along its longitudinal direction. In this case, the thermal stress produced in the substrate by the thermal treatment is reduced by the pad oxide film 2. Thereafter, the pad oxide film 2 and the silicon nitride film 3 are removed. The element isolation structure for isolating the memory cells from each other is not limited to the field shield oxide film 6 as above-mentioned and may be a field-shield element isolation structure in which the element isolation is carried out by a shield electrode formed on the silicon substrate 1 with an insulating film interposed therebetween.

Next, as shown in FIG. 2E, after a sacrificial oxide film (not shown) is formed on the surface of the silicon substrate 1 in the element region surrounded by the field oxide film 6 and then removed, a tunneling oxide film 7 is formed at a thickness of about 10 to 12 nm by the thermal oxidation process on the surface of the silicon substrate 1 surrounded by the field oxide film 6. An oxynitride film formed by nitriding a silicon oxide film by a rapid thermal oxidation process within an ammonia atomsphere may be used in place of the tunneling oxide film 7. When using the oxynitride film as a tunneling film, it is possible to restrict the generation of leak current thereby increasing the reliability of the memory cell. Thereafter, a polycrystalline silicon film 8 is formed on an entire surface of the substrate at a thickness of about 50 to 100 nm by the CVD process and a silicon nitride film 9 is formed thereon at a thickness of about 50 nm by the CVD process. Further, an impurity of phosphorus or the like is introduced into the polycrystalline silicon film 8 during the CVD process or by solid-phase doping after film-formation by the CVD process.

Figure 2F:
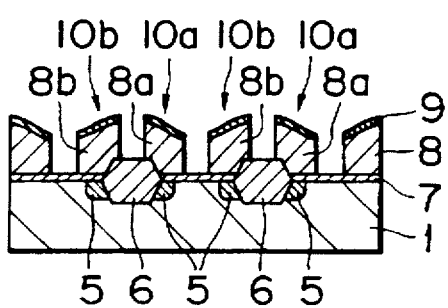

Next, as shown in FIG. 2F, the polycrystalline silicon film 8 and the silicon nitride film 9 are selectively removed at portions on the silicon substrate where no source/drain is formed and portions disposed on the field oxide film 6 thereby forming stripe patterns 10a and 10b of the polycrystalline silicon film 8 and the silicon nitride film 9 extending in the longitudinal direction of the field oxide film 6. Consequently, the polycrystalline silicon film 8 is divided into polycrystalline silicon films 8a, each disposed under the stripe pattern 10a, and polycrystalline silicon films 8b each disposed under the stripe pattern 10b. Incidentally, the portions of the polycrystalline silicon film 8 and the silicon nitride film 9 disposed on the field oxide film 6 may not be removed and only one of the stripe patterns 10a and 10b may be formed.

Figure 2G:
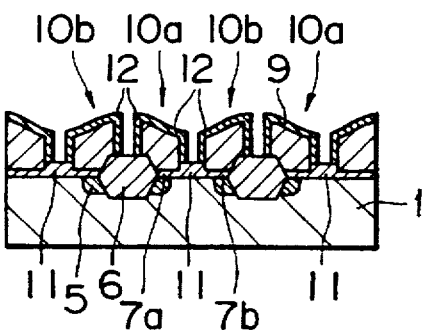

Next, as shown in FIG. 2G, after a part of the tunneling oxide film 7 exposed to a bottom of the groove between adjacent stripe patterns 10a and 10b is removed by etching, a gate insulating film 11 having a thickness of about 20 to 30 nm and a width of about 0.4 μm is formed by thermal oxidation process. In this manner, the gate oxide film 11 is formed after removing a part of the tunneling oxide film 7 which may be damaged by the etching process of forming the stripe patterns 10a and 10b, the gate oxide film 11 having an excellent quality can be obtained. Thus, the gate oxide film 11 is formed so as to be sandwiched between stripes of tunneling oxide film having a width of about 0.2 μm. Further, the gate oxide film 11 may be formed by conducting the thermal oxidation without removing a part of the tunneling oxide film 7 exposed to the bottom of the groove. During the thermal oxidation process, silicon oxide films 12 are formed on the side surfaces of the polycrystalline silicon films 8a and 8b. Further, the tunneling oxide film 7 is divided by the etching process into two pieces 7a and 7b of tunneling oxide film with the gate oxide film 11 interposed between them.

Figure 2H:
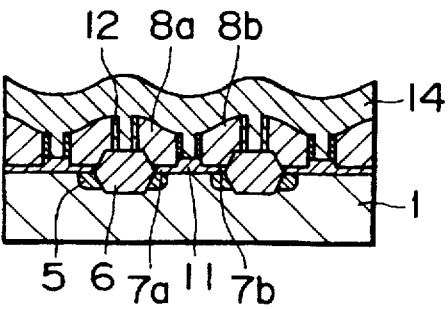

Next, as shown in FIG. 2H, after parts of the silicon nitride film 9 disposed above the polycrystalline silicon films 8a and 8b are removed by heated phosphoric acid, a polycrystalline silicon film 14 is formed on the entire surface by the CVD process at a thickness of about 100 to 300 nm as measured at its portion disposed above any of the polycrystalline silicon films 8a and 8b, while the groove between the stripe patterns 10a and 10b is filled with the polycrystalline silicon film 14. An impurity such as phosphorus is introduced into the polycrystalline silicon film 14, like was done to the polycrystalline silicon film 8.

Figure 2I:
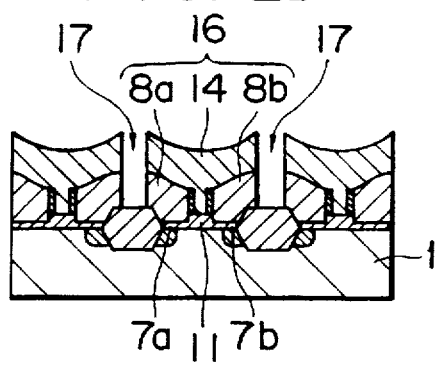

Next, as shown in FIG. 2I, the polycrystalline silicon film 14 and the silicon oxide film 12 are partially removed at the parts thereof formed on the field oxide film 6 by anisotropic etching using photoresist (not shown) as a mask. As a result, stripe patterns of the field oxide film 6 extending in the longitudinal direction and floating gates 16 each having the polycrystalline silicon films 8a and 8b are formed. The polycrystalline silicon film 14 and the silicon oxide film 12 are removed at their parts formed on the field oxide films 6 so that a groove is formed between two adjacent floating gates 16 for separating the adjacent floating gates 16 from each other. Therefore, the silicon oxide films 12 are not necessarily removed and the polycrystalline silicon films 8a and 8b may be partially removed.

Figure 2J:
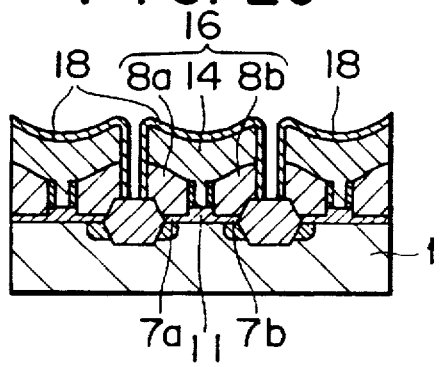

Next, as shown in FIG. 2J, and ONO film (silicon oxide film/silicon nitride film/silicon oxide film) is formed at an equivalent oxide film thickness of about 15 to 20 nm on a surface of each of the polycrystalline silicon films 8a and 8b constituting the floating gate 16. In this case, the silicon oxide film, i.e. the under layer of the ONO film 18 is first formed at a thickness of about 10 nm by thermal oxidation at a temperature of bout 900° to 1000° C. or the CVD process, then the silicon nitride film is formed at a thickness of about 10 nm by the CVD process and the upper layer of the silicon oxide film is formed at a thickness of about 5 nm by thermal oxidation at a temperature of about 900° to 1000° C. or the CVD process.

Figure 2K:
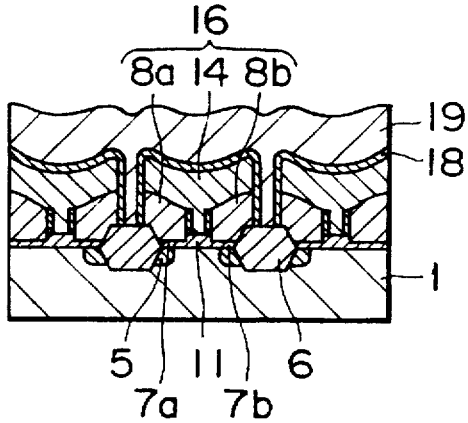

Next, as shown in FIG. 2K, after a polycrystalline silicon film 19 is formed on an entire surface of the substrate, the polycrystalline silicon film 19 and the ONO film 18 having a thickness of 15 nm (equivalent oxide film thickness of 12.5 nm) and including silicon oxide film having a thickness of 10 nm, silicon nitride film having a thickness of 5 nm and silicon oxide film having a thickness of 5 nm are selectively removed by anisotropic etching using photoresist (not shown) as a mask so as to form stripe patterns of the field oxide film 6 extending in a direction perpendicular to the longitudinal direction. Thus, the polycrystalline silicon film 19 is formed into a pattern of control gates (word lines) 20 and the floating gates 16 are separated correspondingly to the respective memory cells in the direction perpendicular to the longitudinal direction of the field oxide film 6. The word lines may be formed of a polycide film, in place of the polycrystalline silicon film 19, in order to lower the resistance of each word line. Thereafter, an interlayer insulating film 21 is formed on the entire surface and wirings (not shown) are made to obtain a flash memory as shown in FIG. 1.

In the above embodiment, since the gate oxide film 11 is formed by the thermal oxidation process after selectively removing the polycrystalline silicon film 8 formed on the tunneling oxide film 7, it is possible to make a flash memory operable by a single-voltage power source of low voltage in short time by a relatively small number of steps. Further, since the parts of the flash memory other than the tunneling oxide films 7a and 7b are prevented from being reduced in thickness during the process of making the same, it is possible to obtain a high concentration of an electric field at the tunneling oxide films 7a and 7b.

Further, since the source/drains 5 are formed in the silicon substrate near the edge portions of each region where the field oxide film 6 is to be formed by a tilted ion implantation process, it is possible to form the source/drains by a simple process and in a self-alignment fashion and it is unnecessary to provide the bit contact or the source contact for each of the memory cells. As a result, the memory cells can be formed with higher integration.

Next, the rewriting operations of this flash memory will be explained. In this specification, a "write state" is defined by such a condition that no electron is present in a floating gate and an "erase state" is defined by such a condition that electrons are stored in the floating gate.

First, to write data into the memory cell shown in FIG. 1A, a bias voltage condition of Vcg=0V, Vd=8 to 9V, Vs=Open and Vsub=0V is established, where Vcg denotes a voltage applied to the control gate 20, Vd denotes a drain voltage, Vs denotes a source voltage, and Vsub denotes a substrate potential. Then, the electrons previously stored in the floating gate electrode 16 are drawn to the drain 5 via a portion of the tunneling oxide film 7b where the drain 5 overlaps with the floating gate electrode 16 by an FN tunneling current. As a result, the threshold voltage of the memory cell under erase state is changed from about 7V about 2V, so that the memory cell is brought into the write state ("1").

In order to erase the data stored in the memory cell, a bias voltage condition Vs=0V, Vcg=11 to 12V, Vsub=0V and Vd=0V is established. Then, electrons are injected into the floating gate with FN tunneling currents through respective portions of the tunneling oxide films 7a, 7b where the floating gate 16 overlaps with the source 5 and the drain 5, respectively. As a result, the threshold voltage of the memory cell is changed from about 2 v to about 7 v so that the memory cell is brought into the erase state ("0").

Next, when reading out the data stored in the memory cell, a bias voltage condition of Vcg=3 v, Vd=1 v and Vs=Vsub=0 v is established so as to prevent hot electrons from being injected into the floating gate 16. Then, whether the memory cell is at the write state or the erase state is determined by checking whether or not the drain current is present.

Figure 3A:
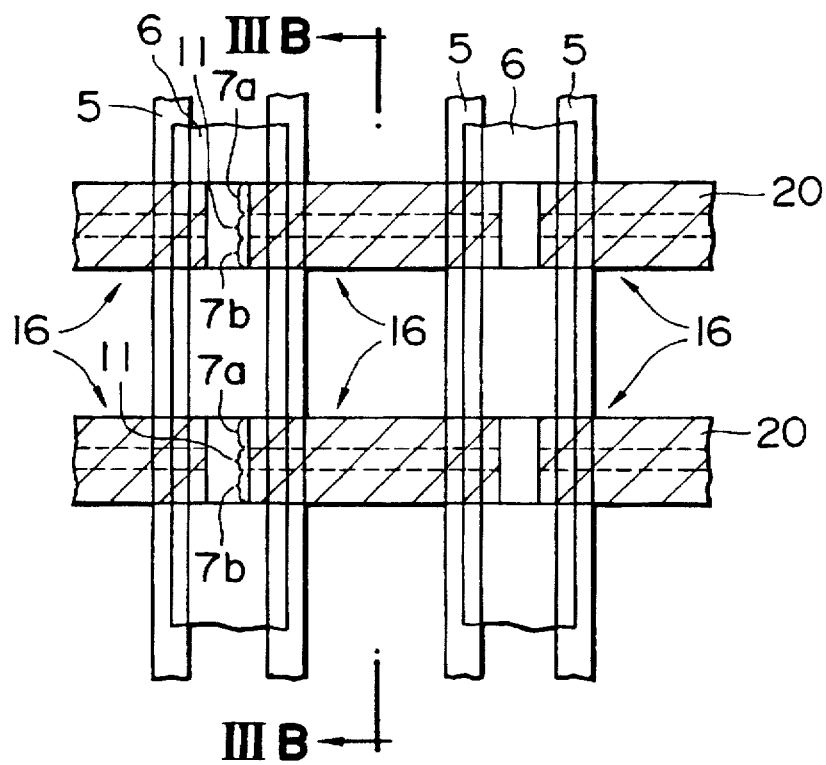
FIG. 3A is a plan view showing an arrangement of elements of a nonvolatile semiconductor memory device made by a method according to a second embodiment of the present invention.
Figure 3B:
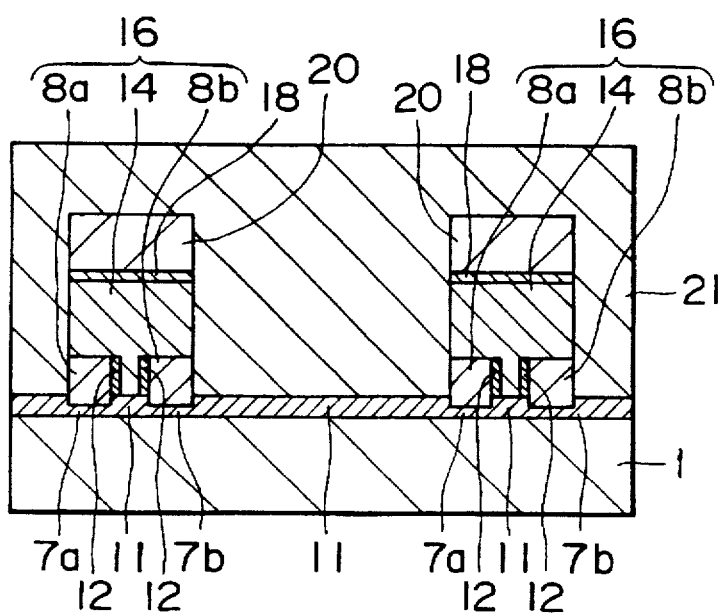
FIG. 3B is a sectional view, taken along a line IIIB—IIIB of FIG. 3A.

FIG. 3A is a plan view showing a structure of a memory cell array portion of a flash memory made by a method of a second embodiment. FIG. 3B is a sectional view taken along a line IIIB to IIIB of FIG. 3A.

In FIG. 3A, a control gate (word line) 20, each being commonly used for a plurality of memory cells, is formed to extend in a direction perpendicular to the longitudinal direction of the field oxide film 6. The floating gates 16 of the respective memory cells are formed in the element region disposed between adjacent field oxide films 6 at areas under the control gates 20, respectively. A gate oxide film 11 having a thickness larger than the thickness of any of the tunneling oxide films 7a and 7b adjacent thereto is formed on the surface of the silicon substrate 1 at an area disposed under each of the floating gates 16 such that the boundary between the gate oxide film 11 and each of tunneling oxide films 7a and 7b extends in a direction along the control gate 20 (see FIG. 3B).

The source/drains 5 of the N-type impurity diffusion layers are formed on the surface of the silicon substrate 1 at the portions near the edges of each field oxide film 6 to extend in the longitudinal direction of the field oxide film 6. In other words, each source/drain 5 is common to a plurality of memory cells arranged long the longitudinal direction of the field oxide film 6. Also, the source/drain 5 is connected to a bit line or the like via a bit contact (not shown) or the like.

In FIG. 3B, each of the memory cells has a floating gate 16, having a polycrystalline silicon film 14 and polycrystalline silicon films 8a, 8b formed on the P-type silicon substrate 1 through the tunneling oxide films 7a, 7b and the gate oxide film 11 interposed there between, and the control gate 20 formed on the floating gate 16 through an ONO film 18. Furthermore, as shown in FIG. 3A, each memory cell includes the source/drains 5 formed on the substrate of the silicon substrate 1 at the portions near the respective edges of the field oxide films 6. On the gate oxide film 11, two silicon oxide films 12 are formed which extend upwardly to boundaries between the polycrystalline silicon film 14 and the polycrystalline silicon films 8a and 8b. Moreover, the memory cell is wholly covered with an interlayer insulating film 21.

As seen from FIG. 3A and FIG. 3B, in the flash memory of the second embodiment, the electrons are injected and also drawn between the source/drain 5 and the floating gate 16 via overlap portions where the source/drain 5 overlaps with or is in direct contact with the respective tunneling oxide films 7a, 7b. There are two overlap portions in each memory cell at the respective source/drains 5 and each overlap portion has a size of approximately 0.1 μm×0.4 μm in the case that the width of the tunneling oxide film is 0.4 μm, for instance. It should be noted that also in this case, only one of the tunneling oxide films 7a, 7b may be formed.

Next, a method of making the flash memory of the second embodiment will now be described with reference to FIG. 4A to FIG. 4F showing the sectional views corresponding to FIG. 3B in the respective steps.

Figure 4A:
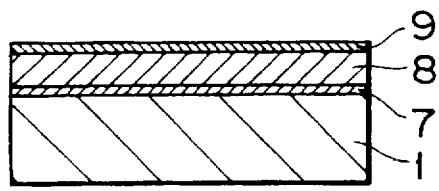
FIGS. 4A to 4F are sectional views in the respective steps of the method of making the nonvolatile semiconductor memory device according to the second embodiment of the present invention.

First, as shown in FIG. 4A, after source/drains (not shown) of impurity diffusion layers have been formed in the surface of the P-type silicon substrate 1 by the tilted ion implantation process in the same manner as in the method of the first embodiment, a field oxide film (not shown) is formed. Thereafter, after a sacrificial oxide film (not shown) has been formed on the silicon substrate 1 in the element region surrounded by the field oxide film and then removed, a tunneling oxide film 7 having a thickness of approximately 10 nm is formed on the silicon substrate 1 surrounded by the field oxide film by the thermal oxidation process. Subsequently, a polycrystalline silicon film 8 having a thickness of approximately 50 to 100 nm and a silicon nitride film 9 having a thickness of approximately 50 nm are successively formed in that order on the entire surface by the CVD process.

Figure 4D:
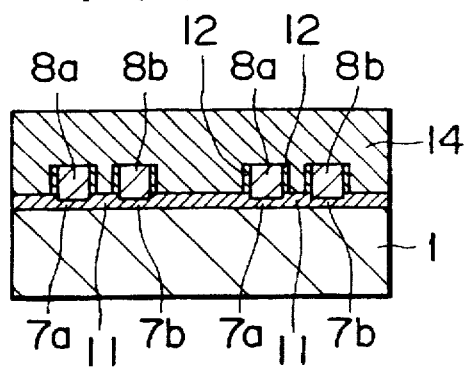
Figure 4B:
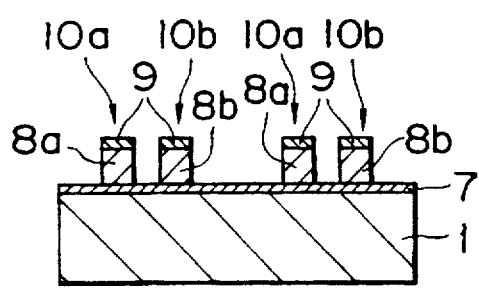

Then, as shown in FIG. 4B, the polycrystalline silicon film 8 and the silicon nitride film 9 are removed at the region other than where the floating gates are to be formed and the regions other than where the gate oxide films are to be formed among the regions where the floating gates are to be formed, thereby forming stripe patterns 10a and 10b of polycrystalline silicon film 8 and the silicon nitride film 9 extending in a direction perpendicular to the longitudinal direction of the field oxide film 6. Consequently, the polycrystalline silicon film 8 is divided into parts the polycrystalline silicon film 8a, being disposed under each stripe pattern 10a and other parts, the polycrystalline film 8b, being disposed under each stripe pattern 10b. In this case, the parts of the polycrystalline silicon film 8 and the silicon nitride film 9 disposed other than the regions where the floating gates are to be formed are not necessarily removed. Further, only the stripe pattern 10a or 10b may be formed.

Figure 4E:
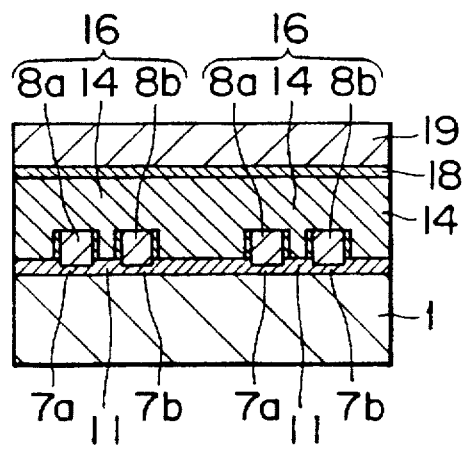
Figure 4C:
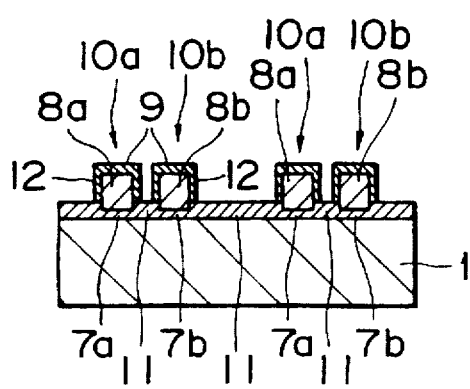

Then, as shown in FIG. 4C, after the tunneling oxide film 7 exposed to a bottom of a groove between adjacent patterns 10a and 10b has been removed by way of the etching process, a gate oxide film 11 having a thickness of approximately 20 to 30 nm is formed by the thermal oxidation process. As a result, the gate oxide film 11 having a width of approximately 0.4 μm corresponding to the distance between the patterns 10a and 10b is sandwiched by the tunneling oxide films 7, each having a width of about 0.4 μm. Alternatively, the gate oxide film 11 may be formed by the thermal oxidation process without removing the tunneling oxide film 7 exposed to the bottom of the groove. By the thermal oxidation, silicon oxide films 12 are formed on side surfaces of each of the polycrystalline silicon films 8a, 8b. Further, in the above-mentioned etching process, the tunneling oxide film 7 is divided into two parts 7a, 7b between which the gate oxide film 11 is interposed.

Next, as shown in FIG. 4D, after the silicon nitride film 9 formed on the polycrystalline silicon films 8a and 8b has been removed by using heated phosphoric acid, a polycrystalline silicon film 14 is formed over the entire surface by way of the CVD process at a thickness of approximately 50 to 100 nm as measured on the polycrystalline silicon films 8a and 8b. At this time, the groove between the patterns 10a and 10b is buried by the polycrystalline silicon film 14.

Then, the polycrystalline silicon film 14 and the silicon oxide film 12 are removed at their portions disposed on the field oxide film 6 by way of the anisotropic etching process using a photoresist (not shown) as a mask. Thus, floating gates 16 are formed in a stripe pattern extending in the longitudinal direction of the field oxide field 6 and formed of two layers of the polycrystalline silicon film 14 and the polycrystalline silicon film 8a or 8b.

Thereafter, as shown in FIG. 4E, an ONO film 18 (silicon oxide film (5 nm)/silicon nitride film (5 nm)/silicon oxide film (5 nm)) having an equivalent oxide film thickness of approximately 15 to 20 nm is formed on the surface of the floating gate 16 including the polycrystalline silicon film 14 and the polycrystalline silicon films 8a and 8b. Alternatively, the ONO film 18 may be formed on the polycrystalline silicon film 14 after having been formed at the step as shown in FIG. 4D. Furthermore, a polycrystalline silicon film 19 is formed on the entire surface.

Figure 4F:
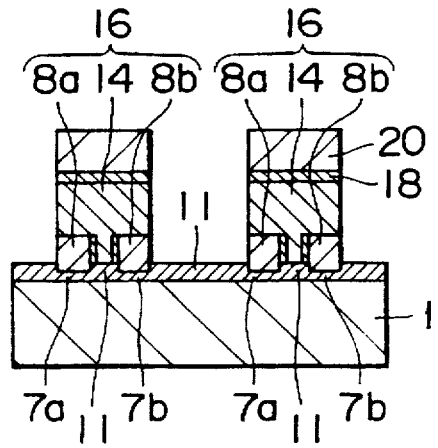

Next, as shown in FIG. 4F, the polycrystalline silicon film 19, the ONO film 18, and the floating gate 16 are selectively etched away by the anisotropic etching process using a photoresist (not shown) as a mask, to form a stripe pattern thereof extending in a direction perpendicular to the longitudinal direction of the field oxide film 6. Thus, the polycrystalline silicon film 19 is formed into a pattern of control gates (word lines) 20 and the floating gates 16 are separated to the respective memory cells in a direction perpendicular to the longitudinal direction of the field oxide film 6. Thereafter, an interlayer insulating film 21 is formed over the entire surface, and furthermore, a wiring pattern (not shown) is provided, so that the flash memory shown in FIG. 4 is manufactured.

According to the second embodiment, since the gate oxide film 11 is formed by the thermal oxidation process at portions from which the polycrystalline silicon film 8 formed on the tunneling oxide film 7 has been selectively removed, it is possible to manufacture a flash memory operable under the low voltage of a single-voltage power source by a relatively small number of steps and in a short time. Since there is no possibility of the portion other than the tunneling oxide films 7a and 7b is unnecessarily etched away when manufactured so that the film thickness thereof becomes thinner, high concentration of an electric field can be attained at the tunneling oxide films 7a, 7b.

Figure 5A:
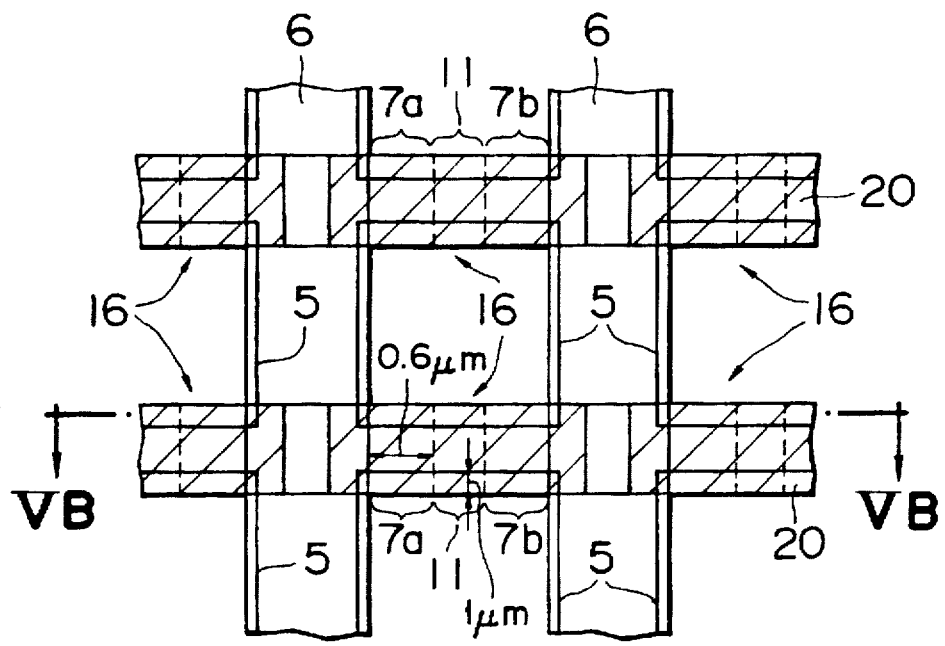
FIG. 5A is a plan view showing an arrangement of elements of a nonvolatile semiconductor memory device made by a method according to a third embodiment of the present invention.
Figure 5B:
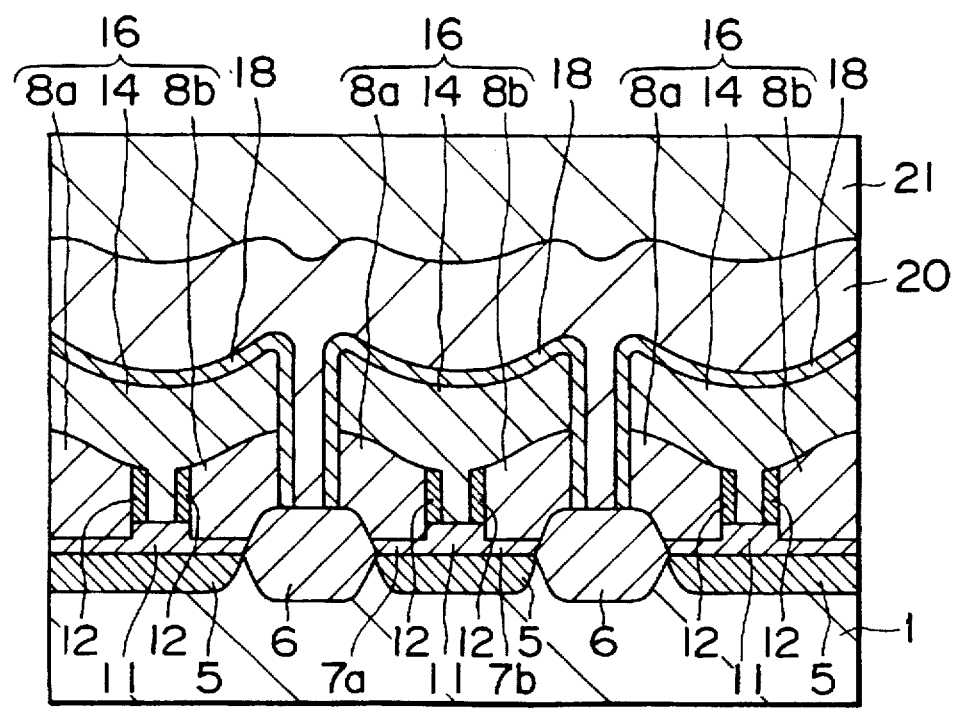
FIG. 5B is a sectional view, taken along a line VB—VB of FIG. 5A.

FIG. 5A is a plan view showing a structure of a memory cell array portion of a flash memory manufactured by a method of a third embodiment. FIG. 5B is a sectional view of the memory cell array portion, taken along a line VB—VB of FIG. 5A.

In FIG. 5A, control gates (word lines) 20, each being commonly used by a plurality of memory cells, are formed to extend in a direction perpendicular to the longitudinal direction of the field oxide film 6. Then, floating gates 16 of the respective memory cells are formed in an element region sandwiched between the field oxide films 6 at portions under the respective control gates 20. A gate oxide film 11 having a thickness larger than the thickness of any of the tunneling oxide films 7a and 7b adjacent thereto is formed on the surface of the silicon substrate 1 at a portion under each floating gate 16 in such a manner that a boundary between each of the tunneling oxide films 7a and 7b and the gate oxide film 11 extends in the direction of the field oxide film 6 (see FIG. 5B).

Each of the source/drains 5 of the N-type impurity diffusion layer is formed in the surface of the silicon substrate 1 at a region surrounded by the control gates 20 and the field oxide films 6. That is, each source/drain 5 is common to two memory cells arranged along the longitudinal direction of the field oxide film 6. The source/drain 5 overlaps with the gate oxide film 11 and the tunneling oxide films 7a and 7b formed under each of the floating gates 16 at an area having a width of about 0.05 to 0.3 µm. One (drain) of the source/drains 5 is connected to a bit line (not shown) through a bit contact (not shown) provided in the region surrounded by the control gate 20 and the field oxide films 6, while the other (source) of the source/drains is connected through a source contact (not shown) to a source line (not shown).

In FIG. 5B, each of the memory cells has a floating gate 16 (formed of polycrystalline silicon film 14 and polycrystalline silicon films 8a, 8b) formed on the P-type silicon substrate 1 through the tunneling oxide films 7a, 7b and the gate oxide film 11, and the control gate 20 formed on this floating gate 16 through an ONO film 18. Furthermore, each memory cell has the source/drains 5, each overlapping with the gate oxide film 11 and the tunneling films 7a and 7b formed under each floating gate 16 at an area having a width of about 0.05 to 0.3 µm. In addition, two silicon oxide films 12 are formed on the gate oxide film 11 to extend upwardly to the boundary between the polycrystalline silicon film 14 and each of the polycrystalline silicon films 8a, 8b. Further, an interlayer insulating film 21 is formed to entirely cover the memory cell.

As seen from FIG. 5A and FIG. 5B, in the flash memory of the third embodiment, the electrons are injected and also drawn between the source/drain 5 and the floating gate 16 via the portion where the source/drain 5 overlaps or directly contacts each of the tunneling oxide films 7a, 7b. Each memory cell has two source/drains, each being overlapped with the floating gate at an area of, for example, about 0.1 µm×0.6 µm (FIG. 5A).

Next, a description will now be made of a method of making the flash memory of the third embodiment. The method according to the third embodiment is the same as that of the first embodiment as explained in FIGS. 2A to 2K, other than a step of forming the source/drain 5. Accordingly, only the step which is different from that of the first embodiment will be explained.

In the third embodiment, the source/drain 5 is not formed by the tilted ion implantation at the step of FIG. 2B, but a normal ion-injection is performed by using both of the control gate 20 and the field oxide film 6 as a mask after finishing the steps up to FIG. 2K. The ion implantation condition at this time is similar to that of the first embodiment except for the ion implantation angle. Then, the impurity implanted at this time is slightly diffused laterally by the subsequent thermal treatment so that the source/drain 5 is formed into such a configuration that the source/drain 5 overlaps with under sides of the gate oxide film 11 and the tunneling oxide films 7a, 7b. As a consequence, in accordance with this embodiment, since the overlap portion between the tunneling oxide films 7a, 7b and the source/drain 5 is formed by laterally diffusing the impurity, there is no step of applying the thermal oxidation to the ion implanted surface of the silicon substrate 1 to form the tunneling oxide film 7, so that the film quality of the tunneling oxide film is improved as compared with that of the first and second embodiments. Therefore, it is possible to obtain a highly reliable memory cell with a very low leak current.

Figure 6A:
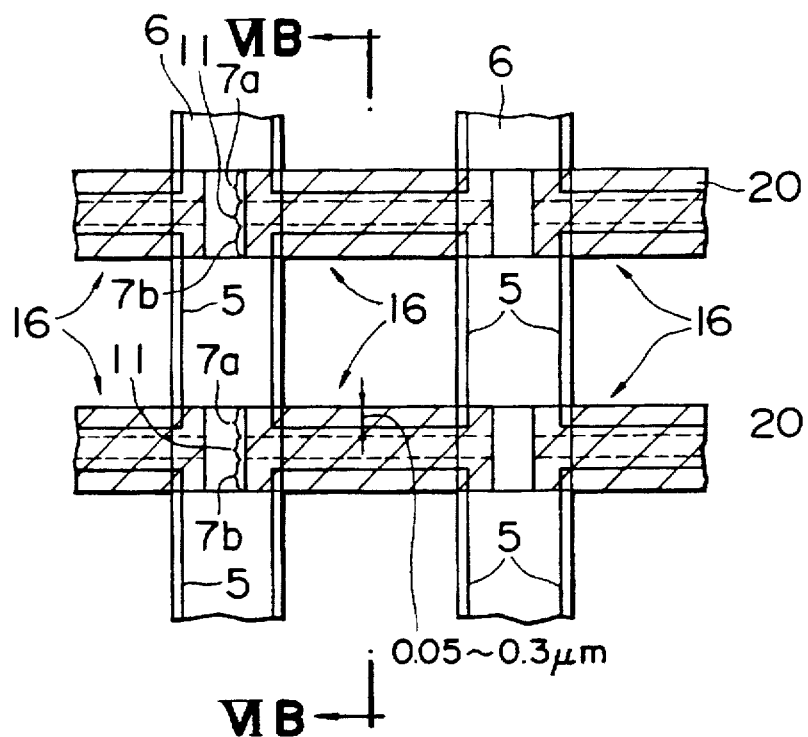
FIG. 6A is a plan view representing an arrangement of elements of a nonvolatile semiconductor memory device made by a method according to a fourth embodiment of the present invention.
Figure 6B:
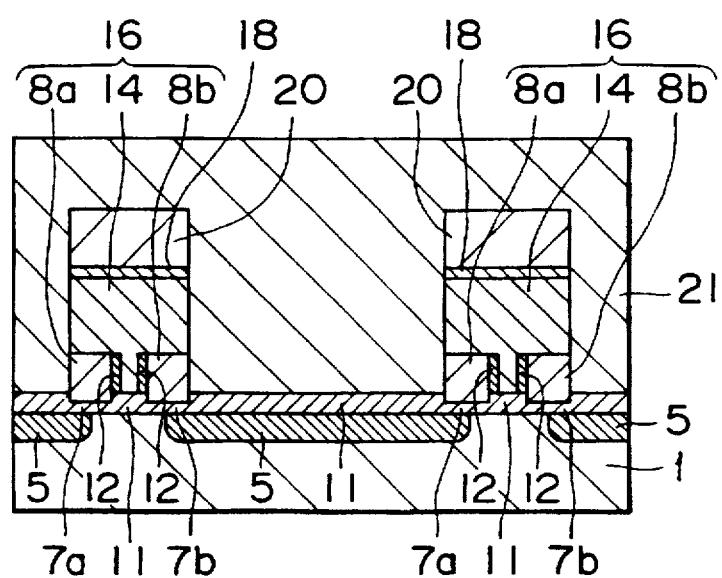
FIG. 6B is a sectional view, taken along a line VIB—VIB of FIG. 6A.
Figure 7A:
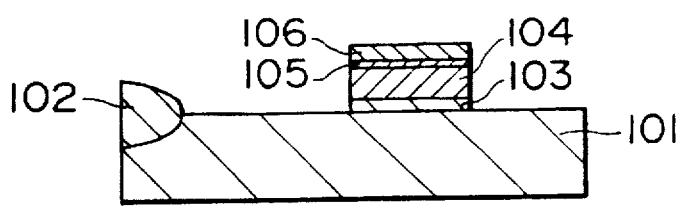
FIGS. 7A to 7F are sectional views in the respective steps of the method of making the conventional nonvolatile semiconductor memory device.
Figure 7B:
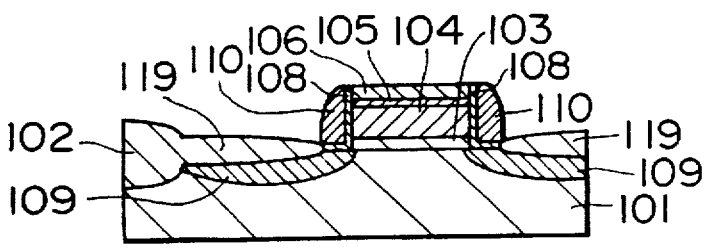
Figure 7C:
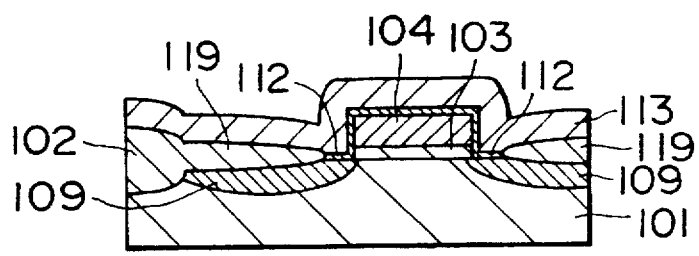
Figure 7D:
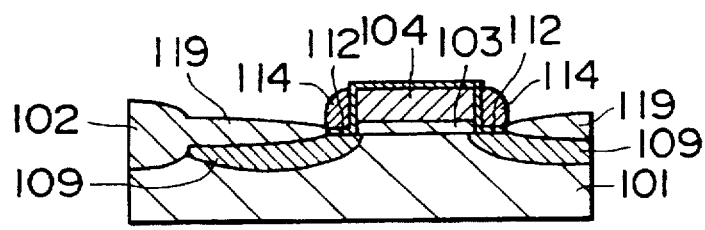
Figure 7E:
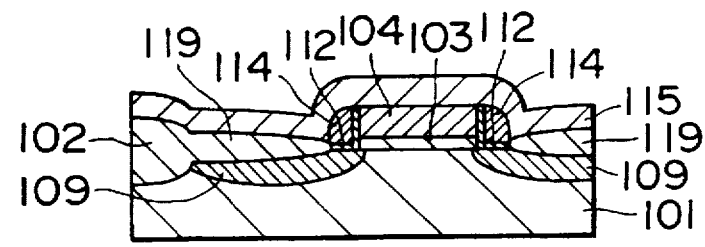
Figure 7F:
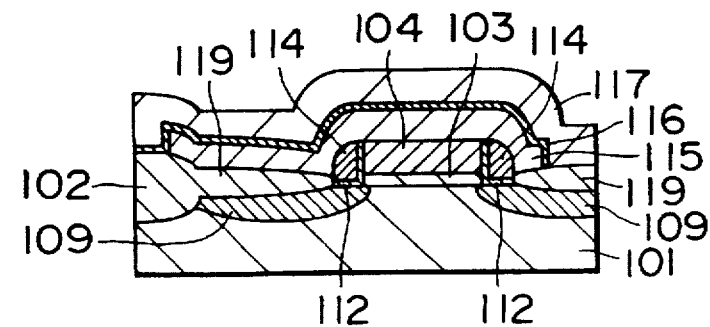

FIG. 6A is a plan view showing a structure of a memory cell array portion of a flash memory manufactured by a method of a fourth embodiment. FIG. 6B is a sectional view of the memory cell array portion, taken along a line VIB—VIB of FIG. 6A.

In FIG. 6A, control gates (word lines) 20, each being commonly used to a plurality of memory cells, are formed to extend in a direction perpendicular to the longitudinal direction of the field oxide film 6. Then, floating gates of the respective memory cells are formed in an element region surrounded by the field oxide film 6 at portions under the respective control gates 20. A gate oxide film 11 having a thickness thicker than the thickness of any of the tunneling oxide films 7a, 7b adjacent thereto is formed on the surface of the silicon substrate 1 at a portion under each floating gate 16 in such a manner that a boundary between each of the tunneling oxide films 7a, 7b and the gate oxide film 11 extends in the direction of the control gate 20 (see FIG. 6B).

Each of the source/drains 5 of the N-type impurity diffusion layer is formed in the surface of the silicon substrate 1 at the region surrounded by the control gates 20 and the field oxide films 6. That is, each source/drain 5 is common to two memory cells arranged along the longitudinal direction of the field oxide film 6. The source/drain 5 overlaps with the tunneling oxide film 7a, 7b formed under each of the floating gates 16 at an area having a width of about 0.05 to 0.3 µm. Each of the source/drain 5 is connected to a bit line (not shown) or the like through a bit contact (not shown) or the like provided in each region surrounded by the control gates 20 and the field oxide films 6.

In FIG. 6B, each of the memory cells has a floating gate 16 of polycrystalline silicon film 14 and polycrystalline silicon films 8a, 8b formed on the P-type silicon substrate 1 through the tunneling oxide films 7a, 7b and the gate oxide film 11, and the control gate 20 formed on this floating gate 16 through an ONO film 18. Furthermore, as shown in FIG. 6A, each memory cell includes the source/drains 5, each being formed on the surface of the silicon substrate 1 and partially overlapped with the tunnel oxide film 7a, 7b disposed under the floating gate 16 at a width of about 0.05 to 0.3 µm. On the gate oxide film 11, two silicon oxide films 12 are formed to extend upwardly to the boundary between the polycrystalline silicon film 14 and the polycrystalline silicon film 8a, 8b. Moreover, the entire memory cell is covered with an interlayer insulating film 21.

As seen from FIG. 6A and FIG. 6B, in the flash memory of the present embodiment, the injection and extraction of electrons are performed between each source/drain 5 and the floating gate 16 through the overlap portion where the source/drain overlaps or directly contacts with the tunneling oxide film 7a, 7b. Each memory cell includes two source/drains, each being overlapped with the floating gate at an area of, for example, about 0.1 µm×0.6 µm. Thus, the overlap area is very narrow so that the capacitance between the floating gate 16 and the source/drain 5 can be made very small. As a result, the concentration of electric field is made greater at each of the tunneling oxide films 7a, 7b so that the injection or extraction of electrons by the FN tunneling phenomenon can be performed efficiently. In this case, too, only one of the tunneling oxide films 7a, 7b may be formed.

Next, the description will now be made of a method of manufacturing the flash memory of the present embodiment. The method according to the present embodiment is the same as that of the second embodiment as explained in FIGS. 4A to 4F, other than a step of forming the source/drain 5. Accordingly, only the step which is different from that of the second embodiment will be explained.

In this embodiment, the source/drain 5 is not formed by way of the tilted ion implantation at the step of FIG. 2B, but a normal ion implantation is performed by using the control gate 20 and the field oxide film 6 as a mask after the steps up to FIG. 4F have been completed. The ion implantation condition at this time is similar to that of the first embodiment except for the ion implantation angle. The impurity injected at this time is slightly diffused laterally by the subsequent thermal treatment so that the source/drain 5 is formed into such a configuration that the source/drain 5 overlaps with undersides of the gate oxide film 11 and the tunneling oxide films 7a and 7b. Therefore, the film quality of the tunneling oxide film can be improved by this embodiment as compared with that of the first or second embodiment.

Although the above-described first to fourth embodiments have been described with respect to the flash memory using the stacked gate type memory cell having the floating gate 16, the present invention may be applied to an MNOS type EEPROM to which a high voltage is applied. In this case, a silicon nitride film is employed instead of each of the polycrystalline silicon films 8 and 14, while omitting the silicon nitride film 9 and the ONO film 18.

That is, a method of manufacturing an MNOS type EEPROM comprises the steps, in that order, of: forming a tunneling insulating film on a semiconductor substrate having a first conductivity type; subsequently forming a first nitride film over an entire surface; selectively removing the first nitride film to form a pattern of the first nitride film; forming a gate insulating film having a thickness thicker than that of said tunneling insulating film on the semiconductor substrate at an area where no pattern of the first nitride film is provided by the thermal oxidation process; subsequently forming a second nitride film on the first nitride film; selectively removing at least the second nitride film thereby forming a composite nitride film including said first nitride film and the second nitride film on each of the tunneling insulating film and the gate insulating film, and forming a pattern of conductive film, serving as a gate electrode on the second nitride film.

As above-mentioned, in accordance with the present invention, since the gate insulating film is formed by way of the thermal oxidation process at a portion from which the first conductive film formed on the tunneling insulating film has been selectively removed, the conventional many complicated steps such that first the sidewall film has been formed and after the thermal oxidation is carried out to form the silicon oxide film, and the sidewall film is removed are no longer required. As a result, the device can be manufactured in a relatively short time and the throughput can be improved. Also, there is no possibility of the portion other than the tunneling insulating film is etched unnecessarily so that the thickness of this etched portion becomes thin. Therefore, the concentration of electric field at the tunneling insulating film is not blocked. Accordingly, the nonvolatile semiconductor memory device can be operated at desired low voltage of a single-voltage power source.

I claim:

1. A nonvolatile semiconductor memory device including a plurality of memory cells, each of said memory cells including a MOS type field-effect transistor having a floating gate, said semiconductor memory device comprising:

a semiconductor substrate;

an element-isolation structure formed on a surface of said semiconductor substrate so as to define a plurality of element regions, each of said element regions being defined between at least two linear portions, which extend in parallel to a longitudinal direction, of said element-isolation structure;

each of said MOS transistors being formed in one of said element regions and including a gate oxide film formed on the surface of said semiconductor substrate and having tunneling oxide films at both end portions of said gate oxide film, each of said MOS transistors further including a pair of impurity diffusion layers constituting its source and drain, respectively, formed in the surface of said semiconductor substrate at its regions below respective parts of said tunneling oxide films so that said tunneling oxide films overlap partially with said impurity diffusion layers, respectively; and a pair of separating regions extending from longitudinal center lines of said two linear portions, respectively, perpendicular to the surface of said substrate, each of said separating regions being effective to electrically separate the floating gate of the memory cell formed in one of the element regions defined between said two linear portions from the floating gate of the memory cell formed in another element region adjacent to said one element region.

2. A nonvolatile semiconductor memory device as claimed in claim 1 wherein each of said tunneling oxide films has a thickness smaller than that of a center portion of said gate oxide film.

3. A nonvolatile semiconductor memory device as claimed in claim 1, wherein each of said tunneling oxide films has a thickness smaller than that of a center portion of said gate oxide film and each of said pair of impurity diffusion layers is separated from the center portion of said gate oxide film.

4. A nonvolatile semiconductor memory device as claimed in claim 1, wherein said floating gate is formed so as to overlap with each of said linear portions of said element-isolation structure.

5. A nonvolatile semiconductor memory device as claimed in claim 4, wherein said floating gate is overlapped with each of said pair of impurity diffusion regions at an overlapping area extending along said longitudinal direction, and said overlapping area has a width equal to, or shorter than 0.18 µm in a lateral direction.

6. A nonvolatile semiconductor memory device as claimed in claim 1, further comprising a control gate common to the memory cells located adjacent to each other in a lateral direction intersecting with said longitudinal direction; said control gate including a conductive layer electrically insulated from the floating gates and having a portion extending into each of said pair of separating regions.

7. A nonvolatile semiconductor memory device including a plurality of memory cells, each of said memory cells including a MOS type field-effect transistor having a floating gate, said memory device comprising:

a semiconductor substrate;

at least a pair of element-isolation films formed on a surface of said semiconductor substrate;

an element region formed in a region between said pair of element-isolation films on the surface of said semiconductor substrate;

each of said MOS transistors further including a gate oxide film formed in said element region on the surface of said semiconductor substrate and having two end portions closer to said element-isolation films, respectively, and a central portion therebetween, each of said end portions being formed with a tunneling oxide film having a thickness which is thinner than that of said central portion, and a pair of impurity diffusion layers constituting a source and a drain, respectively, wherein said floating gate is formed so as to cover said gate oxide film and overlap with each of said pair of element-isolation films, and said pair of impurity diffusion layers are formed in the surface of said semiconductor substrate at regions below said tunneling oxide films of the end portions of the gate oxide film, such that there exists a space between an area of the surface of said semiconductor substrate in which each of said impurity diffusion layers is formed and another area of the surface of said semiconductor substrate on which said central portion of said gate oxide film is formed; and an insulating film formed on said floating gate and having a portion extending substantially perpendicular to said surface of the substrate.

8. A nonvolatile semiconductor memory device as claimed in claim 7, wherein each of said pair of impurity diffusion layers is separated from the central portion of said gate oxide film.

9. A nonvolatile semiconductor memory device as claimed in claim 7, wherein the floating gate is formed so as to overlap with each of said pair of impurity diffusion layers at an overlapping area extending along said longitudinal direction, and said overlapping area has a width equal to, or shorter than 0.18 µm in a lateral direction.

10. A nonvolatile semiconductor memory device as claimed in claim 7, further comprising a control gate common to the memory cells located adjacent to each other in a lateral direction intersecting with said longitudinal direction; said control gate including a conductive layer electrically insulated from said floating gate and having a portion extending into each of said pair of separating regions.

* * * * *